US006915566B2

(12) United States Patent
Abbott et al.

(10) Patent No.: US 6,915,566 B2
(45) Date of Patent: Jul. 12, 2005

(54) METHOD OF FABRICATING FLEXIBLE CIRCUITS FOR INTEGRATED CIRCUIT INTERCONNECTIONS

(75) Inventors: Donald C. Abbott, Norton, MA (US); John E. Cotugno, Little Compton, RI (US); Robert M. Fritzsche, Attleboro, MA (US); Robert A. Sabo, Smithfield, RI (US); Christopher M. Sullivan, Rochester, MA (US); David W. West, Pembroke, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/514,762

(22) Filed: Feb. 28, 2000

(65) Prior Publication Data

US 2001/0047880 A1 Dec. 6, 2001

Related U.S. Application Data

(60) Provisional application No. 60/122,297, filed on Mar. 1, 1999.

(51) Int. Cl.[7] .............................................. H01K 3/10
(52) U.S. Cl. ............................ 29/852; 29/846; 29/825; 29/830; 174/264; 174/254; 174/250; 174/255; 174/262
(58) Field of Search .............................. 174/264, 254, 174/250, 255, 260, 261, 262, 52.4; 361/760, 719, 767; 439/67, 65, 74, 83; 29/825, 830, 845, 846, 849, 852

(56) References Cited

U.S. PATENT DOCUMENTS 2,427,144 A * 9/1947 Jensen .......................... 174/255
4,048,438 A * 9/1977 Zimmerman ................. 174/254
4,177,519 A * 12/1979 Kasubuchi et al. ........... 708/190
4,383,363 A * 5/1983 Hayakawa et al. ............. 29/847
4,949,155 A * 8/1990 Tajima et al. ................. 174/255
5,243,142 A * 9/1993 Ishikawa et al. .............. 174/262
5,535,101 A * 7/1996 Miles et al. .................. 361/808
5,600,103 A * 2/1997 Odaira et al. ................. 174/265
5,736,681 A * 4/1998 Yamamoto et al. ........... 174/265
5,737,833 A * 4/1998 Motomura et al. ............. 29/830
5,758,413 A * 6/1998 Chong et al. .................. 29/852
5,798,563 A * 8/1998 Feilchenfeld et al. ......... 257/668
5,870,289 A * 2/1999 Tokuda et al. ................ 361/779
5,909,010 A * 6/1999 Inoue .......................... 174/260
5,979,044 A * 11/1999 Sumi et al. ................... 174/262
6,010,769 A * 1/2000 Sasaoka et al. ............... 428/209
6,052,287 A * 4/2000 Palmer et al. ................ 361/767
6,075,710 A * 6/2000 Lau ............................. 361/760

* cited by examiner

Primary Examiner—Richard Chang
(74) Attorney, Agent, or Firm—W. Daniel Swayze, Jr.; W. James Brady; Frederick J. Telecky, Jr.

(57) ABSTRACT

A method for the fabrication of a double-sided electrical interconnection flexible circuit (200) particularly useful as a substrate for an area array integrated circuit package. A copper matrix with studs (203) is pressed through a dielectric film (201) having a copper layer on the opposite surface, thereby forming an intermediate structure for a flex circuit with self-aligned solid copper vias in a one step process. The contacts are reinforced by plating both surfaces with a layer of copper, and conventional processes are used to complete the circuit patterning.

1 Claim, 7 Drawing Sheets

METHOD OF FABRICATING FLEXIBLE CIRCUITS FOR INTEGRATED CIRCUIT INTERCONNECTIONS

This application claims priority under 35 USC § 119 based upon Provisional Patent Application No. 60/122,297, filed Mar. 1, 1999.

FIELD OF THE INVENTION

The present invention relates generally to flexible circuits and more particularly to a method of fabricating flexible circuits for integrated circuit package interconnections.

BRIEF DESCRIPTION OF RELATED ART

As the demand for cheaper, faster and lower power consuming integrated circuits increases, so must the packing density at the circuit board level. Not only have techniques continually evolved to meet the demand for minimizing dimensions of the transistors and of the electrical interconnections which integrate semiconductor devices, but also the packaging technology has advanced resulting in smaller integrated circuit packages with improved electrical and thermal performance.

Ball Grid Array (BGA) and many Chip Scale Packages (CSP) are integrated circuit packages which are assembled to an external circuit board using an array of solder balls confined within the area of the package. The solder balls are electrically connected to an external circuit board, and the external connections to the chip are made through conductive vias and conductor traces in the package substrate. An example of an area array package is shown in FIG. 1a and is compared to a leaded package illustrated in FIG. 1b. With area array packages, such as the CSP depicted in FIG. 1a, solder balls external contacts 101 eliminate the protruding leads 121 of leaded packages in FIG. 1b, thereby providing a more compact package which requires less circuit board space. A printed circuit substrate 102 supports the die and provides electrical interconnection between the die and external contact solder balls. The printed circuit substrate replaces the die support pad 122 and the internal lead frame 123 of leaded packages in FIG. 1b, allowing improved performance by lower inductance of the shorter interconnection between the chip and the external circuit board. An additional advantage of the printed circuit substrate is achieved by incorporating multiple common power and/or ground planes into the substrate.

Integrated circuit chips 104 are electrically connected to the interconnect circuitry on the substrate either by wire bonding or by flip chip 103 connections. Typical substrates are of rigid printed wiring board construction, or for more advanced small and closely spaced circuits, an unsupported flex circuit provides interconnections. Electrical connection between the printed circuitry 105 on the chip side of the substrate and the external contact solder balls is typically realized by conductive vias 106 through the substrate.

Printed circuits are typically fabricated by preparing by an enlarged-scale artwork master of a circuit pattern and conductor paths, and then the enlarged-scale artwork master is photographically reduced to the desired size. Screens and masks are fabricated according to the reduced circuit pattern for the application of photoresist materials. Processes including etching, screening, plating, laminating, vacuum deposition, via hole formation, and protective coating application are used to fabricated both supported printed circuits and unsupported flexible circuits.

Substrates for area array packages on flex circuits are most commonly fabricated on a dielectric polymer base film in reel or sheet format. A copper metal is applied to both surfaces of the dielectric film either by bonding a thin foil to the base film, or by vapor depositing the metal and subsequently plating to the necessary conductor thickness. Interconnect traces and contact pads are patterned and etched in the metal. Several techniques are known for electrically interconnecting the conductors and contacts on either side of the substrate. Vias are typically formed by mechanical punching or by laser ablation, and the vias are filled with a conductor by plating, by metal deposition during the film metallization, or by filling with conductive pastes. Completing the fabrication of a circuit includes plating a layer of nickel and a thin film of gold over the conductors for environmental protection, and to support solder contacts. A solder mask coating is applied to the circuitry on the surface to be soldered in order to control the solder run out.

All of these fabrication techniques require multiple plating and etching steps. In the case of laser ablation where one via is formed at a time, the process is repetitive and time consuming. Further, the existing techniques for making conductive vias suffer from difficulties in making the through holes consistently conductive, and in aligning the top and bottom circuits with the vias. Via conductivity failures occur either as electrical opens or as intermittent contacts resulting from separations in the thin conductor walls during thermal excursions due to expansion mismatch between the conductor and the substrate, from incompletely coating by vapor deposition, from air pockets entrapped in the vias during plating from both sides of the circuit, from fatigue failures of the thin conductors, from marginal conductivity of the filling material, and/or from marginal contact due to misalignment of the circuit and vias.

It is accordingly desirable to provide a reliable flexible circuit substrate for integrated circuit area array packages, and a method of manufacture that permits high volume production without the reliability issues identified for current processes, and which eliminates the need for costly vapor deposition or multiple laser drilling.

SUMMARY OF THE INVENTION

The principal object of the present invention is to provide a reliable, double sided electrical interconnection flexible circuit which enables interconnecting integrated circuit chips to an external circuit, and a method of manufacturing the flex circuit. The preferred embodiment of the invention provides a flexible circuit substrate for area array packages including conductor patterns on the first surface of a flexible dielectric film which permit interconnection between the chip terminals and from the chip terminals to conductive vias through the dielectric film. It further includes, on the second surface a plurality of contact pads for attachment of solder balls for external contact to a second level of interconnection, and the conductors on the two surfaces are interconnected by reliable, solid metal conductive vias. The unique conductive vias comprise metal studs etched from a metal matrix, preferably comprising copper, and the studs when pressed through the dielectric film contact the conductive material on the first surface of the dielectric. The copper matrix with raised studs is attached to the second surface of the dielectric film, and the unraised portion of the matrix provides the pre-patterned solder ball contact pads.

The flex circuit of the present invention, therefore, includes a plurality of studs etched from a metal matrix with a which serve as both the tool to punch apertures for the vias, and to simultaneously fill the vias. The unraised film portion of the metal matrix provides the base metal which will subsequently be patterned to form the solder ball contacts, and thus the film and the studs become a part of the finished flex circuit.

It is further an object of the invention to provide a predecessor embossing tool for use of and inclusion into the flexible circuit, and a method of manufacturing the tool. The embossing tool comprises a copper matrix etched to form raised studs corresponding to a pattern of conductive vias in a flexible circuit. The etched studs of the copper embossing tool when adhered to the base dielectric film, and a hydraulic force applied, punch a plurality of cylindrical apertures in the film, and simultaneously fill the apertures. When pushed through the dielectric, the studs contact conductors on the opposite surface of to solid conductive vias through the dielectric.

To complete the fabrication of the intermediate base structure for a flex film, additional copper is electroplated onto the surfaces to both increase the conductor thickness, and to seal the connection between the solid Cu via and the copper film on the first surface, thereby insuring robust electrical contact. Subsequently, the copper on both surfaces is photopatterned and etched to provide interconnections and bump solder pads. The patterns on either side are aligned to the vias, thereby eliminating the problems associated with aligning patterns on opposite sides of a film.

It is further an object of the invention to provide a method for fabricating a flex circuit substrate which has high yield, low cost, and is amenable to mass production. In addition to the etched metal matrix, a die set precisely matched to the etched studs facilitates punching apertures for vias in the film. Reel to reel processing and transport are the preferred techniques for fabrication of substrates which may then be assembled into packages using the same format. However, the processes are not limited to this technique, nor is the specific flex circuit application.

In an alternate embodiment, a metal embossing tool is coated in the selective raised areas with a thin film of copper which under temperature and pressure adheres to the dielectric film simultaneously with the embossing process. The embossing tool is removed, leaving depressed interconnect patterns, contact pads and/or vias coated with copper. The exposed copper is subsequently plated with copper. The process eliminates patterning and etching in the manufacture of a flex circuit, as well as the need for a solder mask on solder contact surface.

BRIEF DESCRIPTION OF THE DRAWINGS

FIGS. 4a–4e illustrate the fabrication steps for forming vias in a flex circuit using an etched metal matrix.

DETAILED DESCRIPTION OF THE INVENTION

Figure 1A:
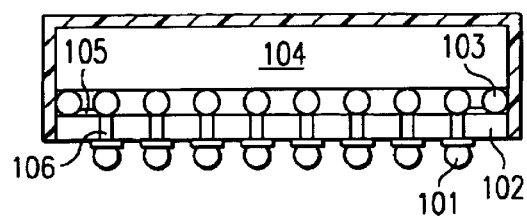
FIG. 1a is an example of an area array chip sized package with flex circuit substrate. (Prior art)
Figure 1B:
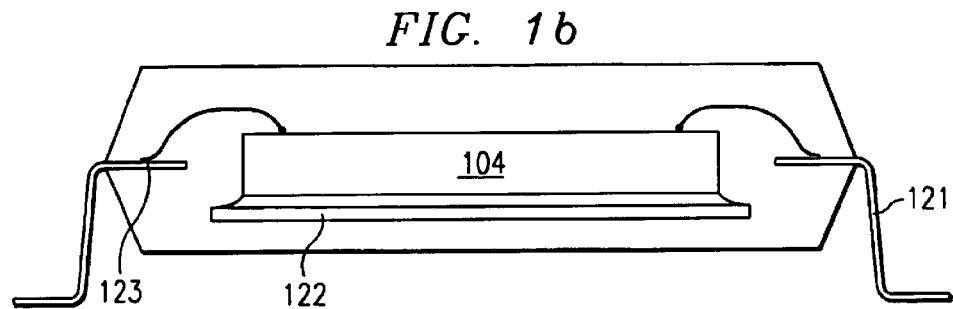
FIG. 1b shows an example of a leaded package with lead frame. (Prior art)
Figure 2A:
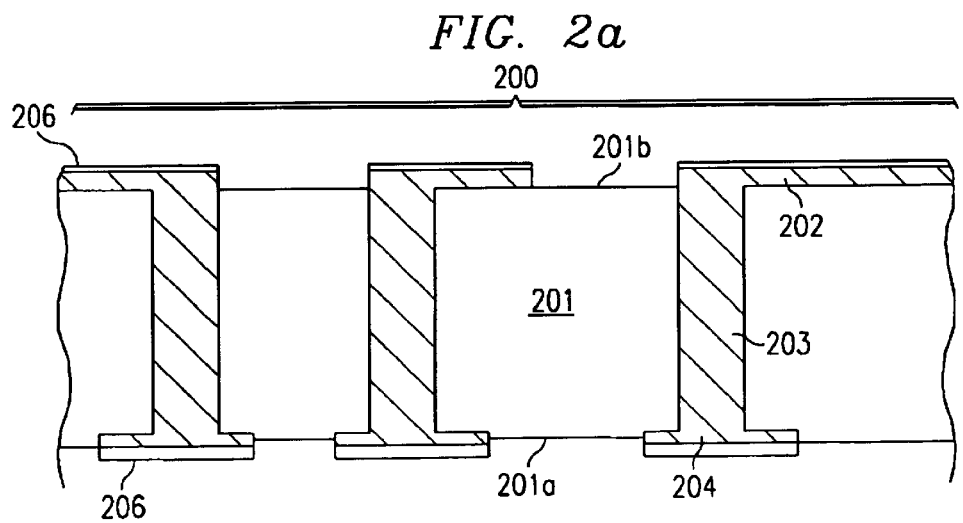
FIG. 2a is a cross sectional view of a flex circuit of the present invention.

In accordance with the preferred embodiment of the current invention, a double sided flexible interconnection circuit 200 for use as an integrated package substrate is shown in cross-sectional view in FIG. 2a. The flex circuit includes a base dielectric film 201 of a flexible polymer patterned on the first surface 201a with interconnection traces 202 from the chip terminal pads to conductive vias 203, which provide electrical contact to solder bump contact pads 204 on the second surface 201b of the dielectric film.

Figure 2B:
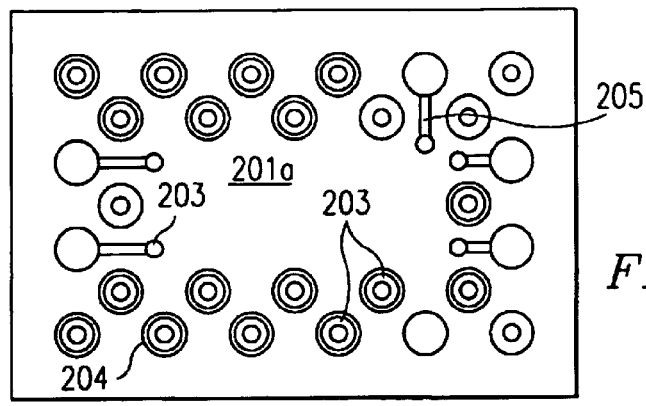
FIG. 2b shows an array of solder bump contact pads and vias of the present invention.

A typical pattern of solder ball contact pads 204 for a flex circuit package substrate is shown in FIG. 2b. The pads 204 on the second surface 201b of the dielectric film are arrayed in a pattern which will align to and allow contact to be made by solder balls (not shown) to a printed wiring board, or other second level of interconnection. As shown in both FIGS. 2a and 2b, the contact pads 204 are interconnected to the conductive vias 203 by metal traces 205, or the pads coincide with and overlap the conductive vias.

Figure 2C:
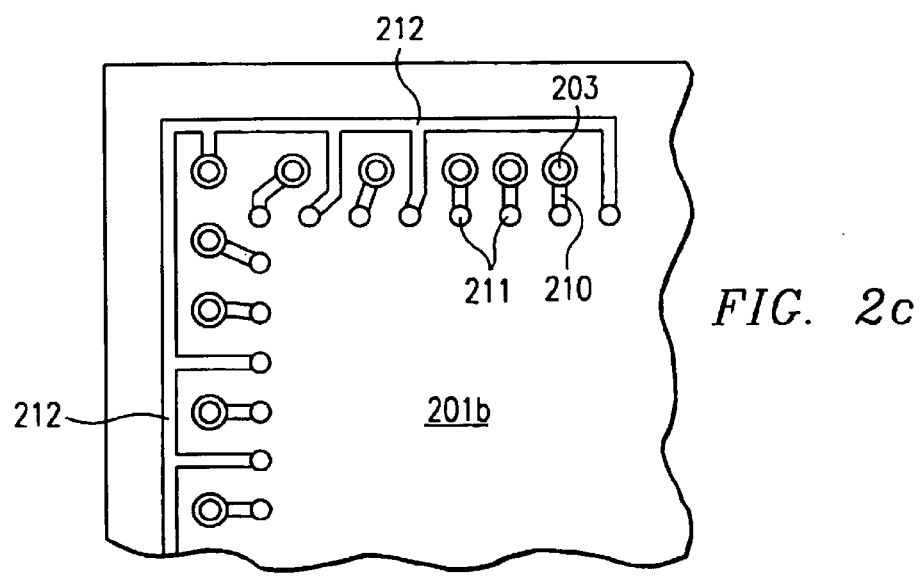
FIG. 2c provides an example of contact pads from chip terminals, interconnection patterns and vias of the present invention.

FIG. 2c provides a section of an exemplary interconnection pattern on the first surface 201a of a flex circuit. A plurality of contact pads 211 for bond wires or flip chip bumps from the chip are interconnected by conductor traces 210 from the pads 211 to vias 203, and/or to shared traces 212 between chip contacts pads, such as for a power or ground bus with multiple contacts by the chip.

A plurality of solid metal conductive vias 203 electrically connect the patterned conductors on each surface of the dielectric film. The conductive vias of the preferred embodiment of the current invention comprise metallic studs etched from a metal matrix. The studs are attached to an unraised portion of the metal matrix on the second surface 201a of the flex circuit. The metal film matrix adhered to the dielectric flex film provides the base metal of the solder ball contact pad 204. The metal matrix with etched studs comprises copper.

An etched metal stud 203 contacts the interconnection pattern 202 on the first surface 201b of the dielectric film, and is intimately attached to the base copper metal of the solder ball contact pad 204 on the second surface 201a of the dielectric film 210, thereby forming a the solid metal conductor via 203. Reliability of the copper stud contact to the conductor pattern on both surfaces of the dielectric film is insured by a layer of plated copper 206 to fill any voids at the interfaces.

The device of this invention has been described wherein the metal matrix with raised studs is a portion of the solder ball pads on the second surface of the dielectric film. In an alternate embodiment, the surfaces are reversed and the metal matrix with studs forms the base metal layer of the interconnect pattern or first surface of the dielectric film, and the copper studs engage with the solder ball contact pads on the second surface.

Interconnection circuitry on the flex circuit substrate further includes a thin film of nickel and gold over the exposed copper patterns to provide environmental protection and a bondable surface. A solder mask surrounds the solder ball pads on the second surface to complete the patterned area of the flex circuit.

The preferred embodiment has been described as a flexible circuit which constitutes the major component and interconnection for an integrated circuit substrate, however, it is not limited to this application, but is intended to cover flexible circuits having interconnections on two sides.

Turning now to a method of fabricating the flex circuit of the current invention having a plurality of conductive vias comprising the etched studs of a metal matrix which serve to electrically interconnect the circuitry on the two surfaces of the flex film substrate. It is necessary to fabricate a metal matrix having raised studs corresponding to a pattern of vias for a specified flex circuit. The matrix with raised studs constitutes the tool used to punch the apertures for vias, to fill the vias with the studs, and to provide the base metal for the solder ball contact pads on the second surface of the dielectric film.

Figure 3A:
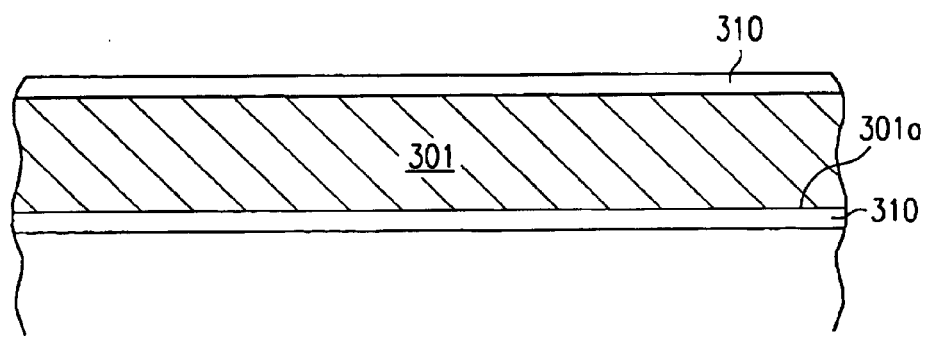
FIGS. 3a–3d are illustrations of fabrication steps for an etched metal matrix for subsequent flex circuit application.
Figure 3B:
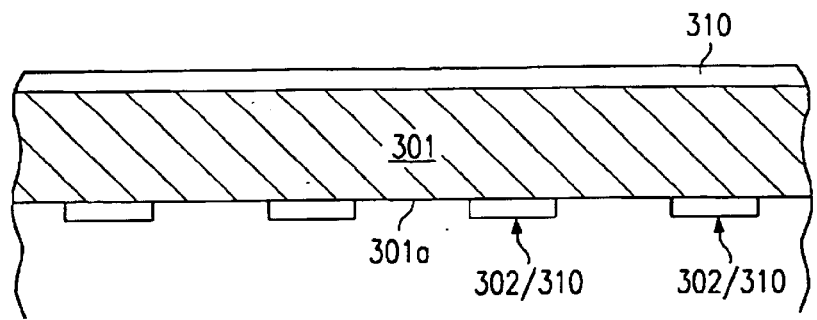
Figure 3C:
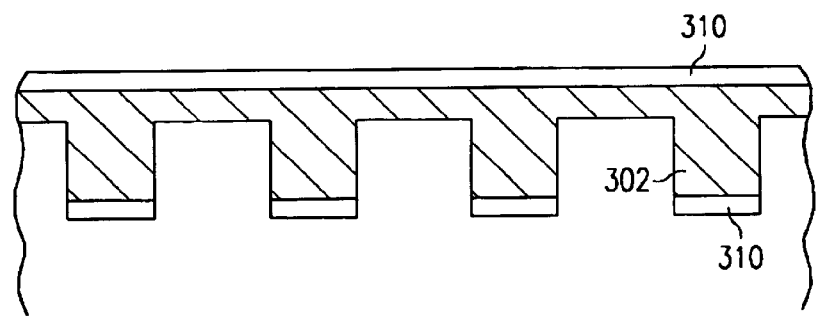
Figure 3D:
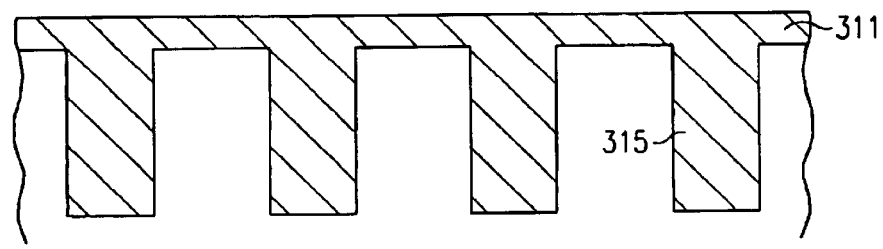

FIGS. 3a through 3d illustrate cross sectional views of a the process steps for forming a metal matrix tool to be used subsequently to fabricate a flex circuit. A strip of a conductive metal 301, preferably comprising copper, in the range of 0.003 to 0.006 inches in thickness is coated with a photoresist 310 on both major surfaces, as shown in FIG. 3a. A plurality of photoimaged via sites 302 are developed on the first surface 301a in a conventional manner, i.e., artwork is placed over the photoresist and the photoresist is exposed using a high intensity UV light source. As seen in FIG. 3b, the photoimaged via sites 302 on the first surface 301a are protected by photoresist 310 and the exposed metal is partially etched in FIG. 3c using a commercially available ammoniacal copper etchant. The photoresist is then removed using a commercially available stripping solution, leaving a copper film 311 with a plurality of etched studs 315, as shown in FIG. 3d wherein the transverse studs 315 correspond to the via pattern for a flex circuit substrate. The metal matrix after etching is in the range of 0.00075 to 0.0015 inches thick in the etched areas 311 and in the range of 0.003 to 0.006 inches in the protected areas. The raised, unetched areas of metal are used as studs 315 in the flex circuit fabrication. Height of the studs will be selected as a function of the thickness of the flex circuit substrate; i.e., the studs must be of sufficient height to completely pierce the flex film.

A reverse image of the photomask for the embossing tool is used to fabricate a die plate precisely matched to the vias. The die plate provides an opening through which residue from the punching operation will be extruded; this will be discussed later under the subject of mechanization.

Figure 4A:
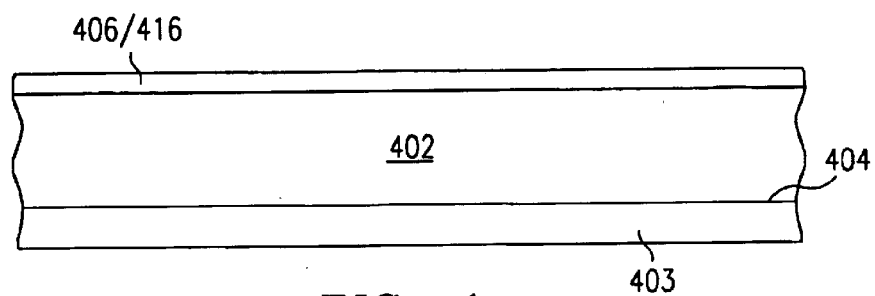

FIGS. 4a through 4d illustrate the steps to form solid vias for a flex circuit using the etched metal matrix 305 fabricated in FIGS. 3a through 3d. In FIG. 4a, a commercially available dielectric film 402, such as a polyimide polymer in the range of 0.003 to 0.006 inches thick having an unpatterned copper layer 403 attached to first surface 404 is the base material for a flex circuit of the current invention. The copper layer is in the range of 0.0005 to 0.0015 inches thickness. The second major surface 406 of the dielectric film is cleaned, and with a heat activated adhesive material 416.

Figure 4B:
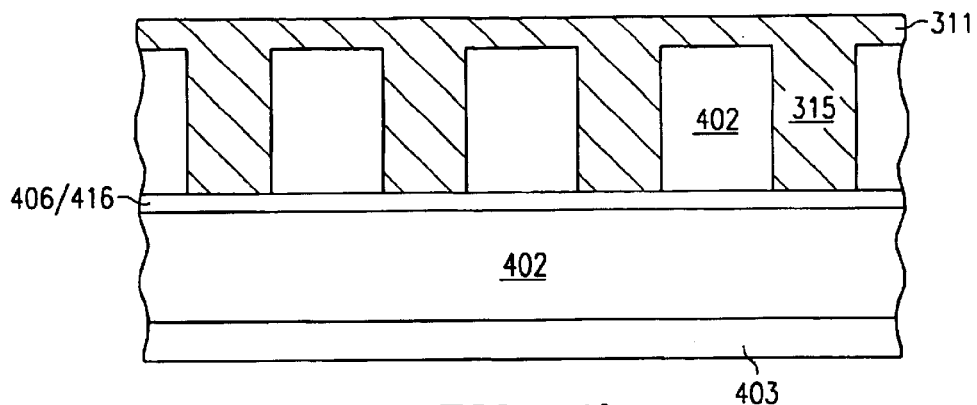

In FIG. 4b, the copper matrix 311 with etched studs 315 is positioned on the adhesive coated second surface 406 of the dielectric film 402. The copper film matrix and studs are selected so that the height of the studs 315 are equal to, or greater than the thickness of the dielctric film 402 with associated copper film 403.

Figure 4C:
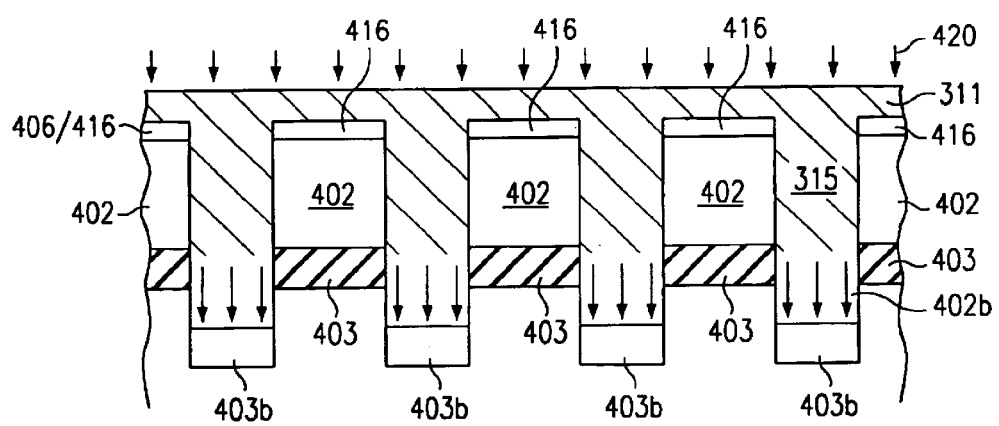

In FIG. 4c, the assemblage from FIG. 4b is positioned in a hydraulic press and pressure as indicated by arrows 420 is applied to said assemblage, whereby the solid copper studs 315 force a plurality of cylindrical apertures in the dielectric film 402 and associated copper layer 403. The material extruded from the film by the studs is represented as compressed dielectric layer 402b and copper 403b.

Figure 4D:
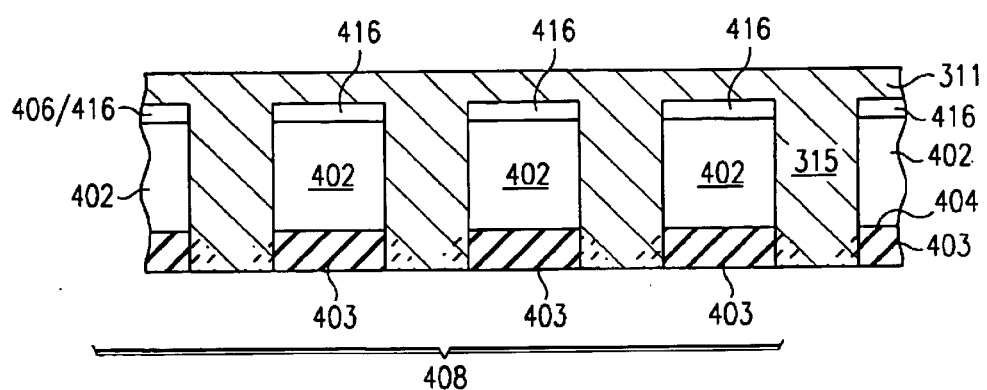

The apertures are filled by the copper studs 315 simultaneously with the punching to forming a plurality of solid copper vias in the dielectric film 402. Within the same process, the copper matrix film 311 contacts the adhesive material 416 on the second surface 406 of the dielectric film. In FIG. 4d, the assemblage is passed through a heated press to insure adhesion of the copper matrix 311 to the adhesive 416 coated second surface 406 of the dielectric film.

The vertical surfaces of the copper studs 315 of the studs opposite the film matrix 311 terminate in contact with the copper layer 403 on the first surface of the dielectric. The copper stud 315 and the copper layer 403 are press fit forming an intact solid copper layer 408 on the second surface of the flex film.

Figure 5A:
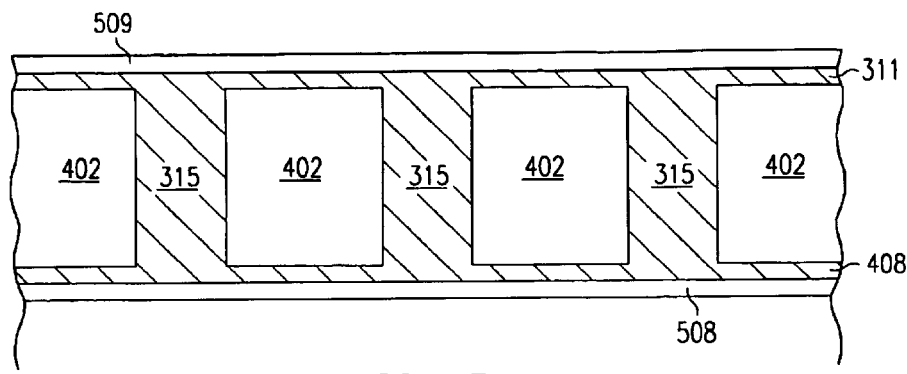
FIGS. 5a–5c show the plating process steps for fabricating a flex circuit with an etched metal matrix in place.

In FIG. 5a the flex film 402 with copper layer 408 and the copper matrix film 403 on one surface, and copper matrix 311 on the opposite surface are passed through a copper electroplating step wherein a thin film of plated copper 509 is deposited over the exposed copper layers. The plated copper 509 insures a reliable layer of copper and fills any defects from processing or mating of layers. Conventional electroplating processes of cleaning, surface activation, plating, rinsing and drying are used to plate the copper layers 509 on the existing copper layers. These steps have formed an intermediate base structure for a flex circuit, having solid metal vias attached to a copper layer on both surfaces.

The process steps illustrated in FIGS. 4a through 4d result in a copper clad flexible dielectric film including a plurality of solid metal filled conductive vias in an array corresponding to the via conductor paths through a circuit pattern for an integrated circuit package for ball grid array or chip scale package substrate. The additional copper plated layer 509 insures a uniform, void free copper surfaces. The simple, one step punch and fill vias from an etched metal matrix replaces the costly, multistep laser ablation, cleaning, metal vapor deposition and plating filling of exiting technology, and further results in a robust self-aligned connection between the conductor surfaces.

Figure 5B:
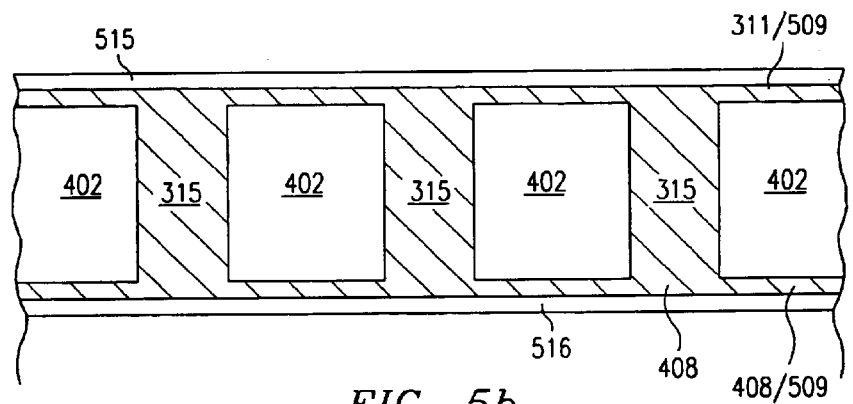
Figure 5C:
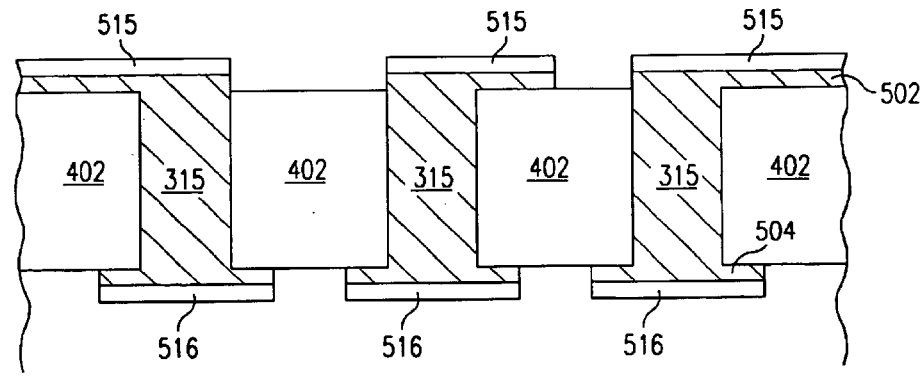
Figure 5D:
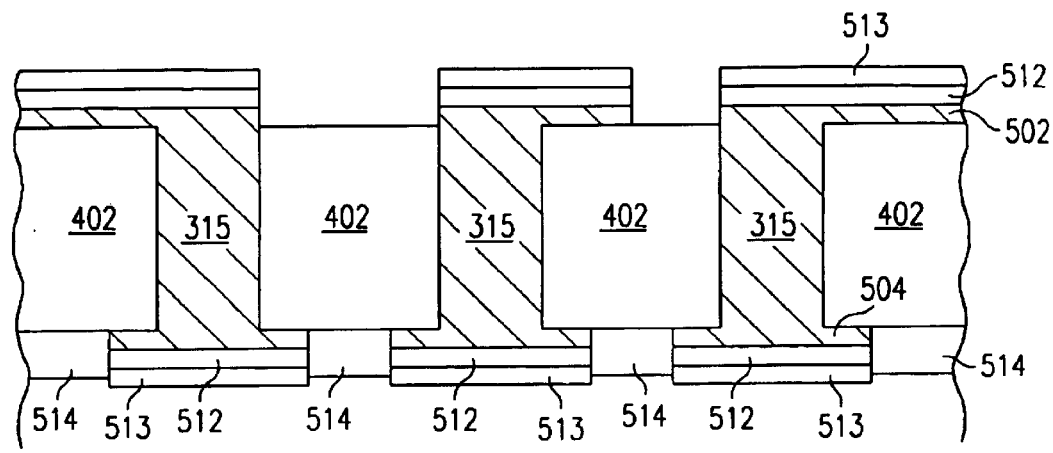

FIGS. 5b through 5d illustrate the near conventional steps to complete fabrication of a flex circuit substrate using the dielectric film 402 with copper layers 408/509 on the first surface and layers 311/509 on the second surface, and with conductive vias 315 as produced in FIGS. 4a through 4d. In FIG. 5b, conventional processes are used to laminate a photosensitive film 515 to the first surface of the via filled film, and a circuit interconnection photomask is aligned to the vias, and exposed by a strong UV light source. A second photoresist layer 516 is laminated to the second surface, a photo pattern for the solder ball contact pads is aligned to the vias, and exposed. The photoresist patterns on both sides are developed and the exposed copper films are etched to form the substrate patterns as demonstrated in FIG. 5c using the patterned photoresist to protect the copper of the circuit pattern 502, the solder ball pads 504 and the underlying vias 315 during copper etching.

The photoresist is removed by conventional stripping methods and in FIG. 5d, the metal patterned surfaces are plated first with nickel 512 and with gold 513 to protect against environmental and chemical attack. A solder mask 514 is applied to the solder ball contact pad surface surrounding each of the metal pads.

Processes and material required for completing the metallization overlying the patterned copper circuits are typical of those used for flex circuit formation, except that alignment of the patterns is specifically to filled vias, as opposed to some existing technology wherein the surfaces are patterned and subsequently vias formed which must align to and connect the patterns on both surfaces.

Mechanization for fabricating a flexible circuit for use as an integrated circuit area array package substrate is well adapted to reel to reel film transport. The appropriate film width will be selected for single or multiple packages, as required by the end user transport equipment. Continuous processing to form an intermediate structure for a flex circuit includes the following steps: alignment of a metal matrix having etched studs to a dielectric film, and to a die plate having apertures specifically matched to the vias, compressing the matrix and film, heating to adhere the matrix to a heat sensitive adhesive and plating the copper coated structure. Further, continuous processing to pattern the circuit includes the steps of photolithography, copper etching, and electroless plating the patterns.

Figure 6:
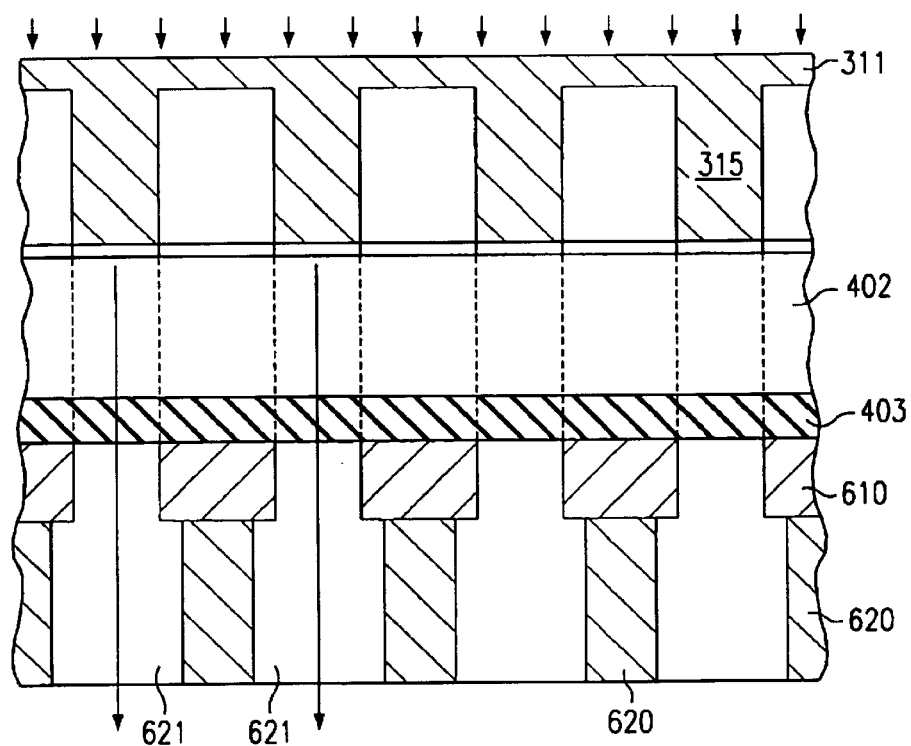
FIG. 6 demonstrates a die tool set to facilitate aperture punching.

FIG. 6 provides a schematic of an assemblage wherein a die plate 610 precisely matched to the studs 315 is positioned atop a second die plate 620 having larger openings, and constructed from a stiffer material to withstand repeated application of pressure. The tooling assemblage is housed inside a hydraulic press. The dielectric film with copper studs and surfaces is positioned atop the die press, studs 315 aligned to the first die plate 610 and pressure applied. As pressure is applied, apertures in the dielectric film 402 and copper layer 403 are punched by the embossed studs 315, through the openings in the die plate, while the film structure is supported by the die plates 610 and 620. The residue from the formation of apertures in the film is ejected through the larger openings at points 621.

The film with assembled metal matrix is subsequently transported to a position in the press having a solid plate wherein the film assemblage is heated and compressed, which enables the copper studs to be press fit against the copper film on the second surface and against the walls of the dielectric film, as shown in FIG. 4*d*. Reel to reel mechanization facilitates photolithography, etching and plating processes as required for the flex circuit production.

An alternate technique for fabricating the conductor patterns and vias of a flex circuit package substrate using an embossing tool includes the following steps. Securing a metal matrix with embossed studs and/or conductor patterns fabricated from known technology such as electroforming or etching, coating the raised areas with a loosely held thin film of copper, transferring the copper film to a dielectric film using heat and pressure, physically removing the matrix, and subsequently plating the appropriate thickness of copper over the thin film of copper. The process is repeated on the second surface having a pattern of solder ball contact pads aligned to the preformed vias. The embossed-film is plated with copper from both sides, using the transferred metal as the seed layer.

Figure 7:
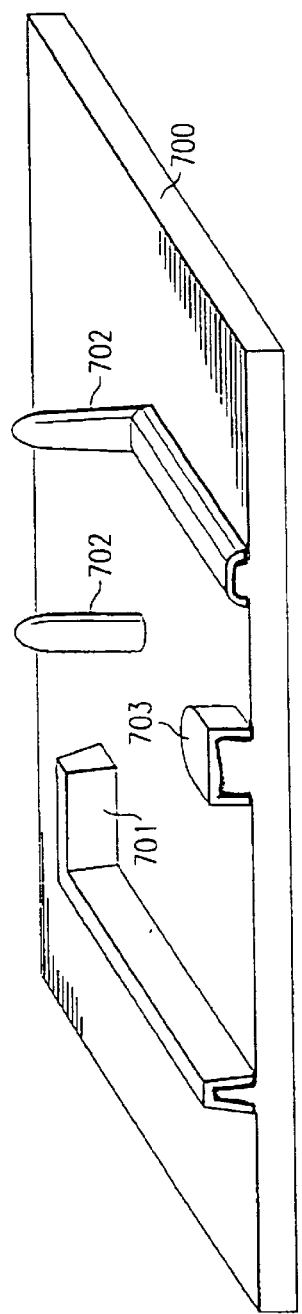
FIG. 7 shows the surface of an embossing tool with thin film copper coating on the raised areas.

A schematic drawing of the tool for side one is given in FIG. 7. In FIG. 7, raised areas for the conductor pattern 701, the via punches 702 and pad sites 703 are coated with a thin layer of copper. The base material 700 of the embossing tool is a metallic film. In similar manner, an embossing tool for the second side of the flex circuit includes raised solder ball contact pads, interconnections to vias and vias coated with a thin film of copper.

The copper film is selectively applied to raised portions 701, 702, and 703 of the tool from a copper powder in suspension adhering to thermoplastic adhesive on the tool, or by use of an embossing tool comprising iron, permanently masking the area where no copper is desired and plating a film of copper on the raised portions.

Figure 8:
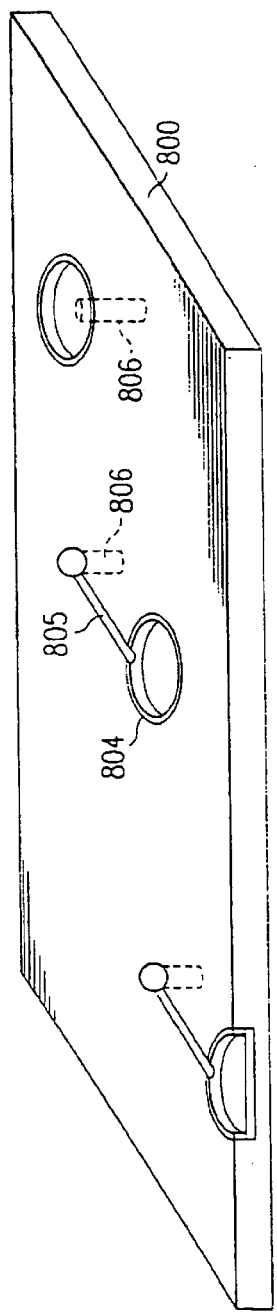
FIG. 8 shows the depressed and metallized solder ball contact pads, vias and interconnections to vias.

FIG. 8 depicts the dielectric second surface of the flex circuit 800 with depressed solder ball contact pads 804 and interconnections 805 to some vias 806 resulting from embossing the dielectric film, coating the recesses with a thin film of loosely held copper, and subsequently plating copper onto the "seed copper. The dielectric serves the purpose of a solder mask between the contact pads and eliminates the need for this material.

Similar mechanization facilitates the embossing process for this transfer method as the preferred embodiment described earlier; i.e. reel to reel processing with heated press to effect the embossing procedure.

Advantages of the emboss and transfer method are that no etching or photolithography are required in the flex circuit process itself and that the conductor and contact pads are recessed into the dielectric film.

While the invention has been described in connection with preferred embodiments, it is not intended to limit the scope to a particular form set forth, but on the contrary, it is intended to cover alternatives, modifications and equivalents as may be included within the spirit of the invention and the scope of the invention as defined by the appended claims.

What is claimed is:

1. A method of manufacturing a flex circuit on a flexible base polymer film including the steps of:
   a) superimposing on said film an embossing tool having raised areas comprising a pattern of conductors and vias corresponding to a circuit design, wherein, said raised areas are coated with a thin layer of metal, comprising copper,
   b) applying heat and pressure to simultaneously emboss the film and to transfer said thin metal layer from the embossing tool to the polymer film,
   c) removing the embossing tool,
   d) embossing a pattern corresponding to that of the second surface of a flex circuit, and simultaneously transferring a thin layer of metal into the embossed pattern,
   e) physically removing the embossing tool,
   f) plating a layer of copper to fill the vias and conductor patterns on both sides of the film,
   g) plating a layer of nickel and gold onto the exposed copper patterns, and
   h) applying a solder mask on the surface of the film surrounding the solder ball contact pads.

* * * * *